(12) United States Patent
Su et al.

(10) Patent No.: US 8,053,808 B2
(45) Date of Patent: Nov. 8, 2011

(54) LAYOUTS FOR MULTIPLE-STAGE ESD PROTECTION CIRCUITS FOR INTEGRATING WITH SEMICONDUCTOR POWER DEVICE

(75) Inventors: Yi Su, Sunnyvale, CA (US); Anup Bhalla, Santa Clara, CA (US); Daniel Ng, Campbell, CA (US); Wei Wang, Santa Clara, CA (US); Ji Pan, Santa Clara, CA (US)

(73) Assignee: Alpha & Omega Semiconductor, Ltd. (BM)

( * ) Notice: Subject to any disclaimer, the term of this patent is extended or adjusted under 35 U.S.C. 154(b) by 258 days.

(21) Appl. No.: 11/804,906

(22) Filed: May 21, 2007

(65) Prior Publication Data

US 2008/0290367 A1  Nov. 27, 2008

(51) Int. Cl.
*H01L 29/66* (2006.01)

(52) U.S. Cl. . 257/173; 257/355; 257/356; 257/E21.355; 257/E21.356; 438/140; 438/141

(58) Field of Classification Search ......... 257/23, 257/49, 107, 173, 328, 355–363, 452, 481, 257/605, E21.09, E29.264, 338, 601, 288, 257/E27.016, E27.06, E25.024, E29.013, 257/E29.029, E27.009, E27.013, E21.355, 257/E21.356; 438/380, 140, 141, 306, 694, 212, 237, 268; 437/41

See application file for complete search history.

(56) References Cited

U.S. PATENT DOCUMENTS

| | | | | |
|---|---|---|---|---|
| 5,397,914 | A * | 3/1995 | Suda et al. | 257/570 |
| 6,249,023 | B1 * | 6/2001 | Finney | 257/328 |
| 6,351,363 | B1 * | 2/2002 | Wang | 361/111 |
| 6,762,461 | B2 * | 7/2004 | Kawamoto | 257/358 |
| 2002/0088991 | A1 * | 7/2002 | Hisamoto | 257/172 |
| 2004/0012052 | A1 * | 1/2004 | Kawamoto | 257/362 |
| 2006/0071276 | A1 * | 4/2006 | Zundel et al. | 257/355 |

* cited by examiner

*Primary Examiner* — Cuong Q Nguyen
*Assistant Examiner* — Yosef Gebreyesus
(74) *Attorney, Agent, or Firm* — Bo-In Lin

(57) ABSTRACT

A semiconductor power device supported on a semiconductor substrate includes a plurality of transistor cells each having a source and a drain with a gate to control an electric current transmitted between the source and the drain. The semiconductor further includes a source metal connected to the source region, and a gate metal configured as a metal stripe surrounding a peripheral region of the substrate connected to a gate pad wherein the gate metal and the gate pad are separated from the source metal by a metal gap. The semiconductor power device further includes an ESD protection circuit includes a plurality of doped polysilicon regions of opposite conductivity types constituting ESD diodes extending across the metal gap and connected between the gate metal and the source metal on the peripheral region of the substrate.

17 Claims, 12 Drawing Sheets

LAYOUTS FOR MULTIPLE-STAGE ESD PROTECTION CIRCUITS FOR INTEGRATING WITH SEMICONDUCTOR POWER DEVICE

BACKGROUND OF THE INVENTION

1. Field of the Invention

The invention relates generally to the layout and manufacturing process of the semiconductor power devices. More particularly, this invention relates to an improved layout of multiple-stage electrostatic discharge (ESD) protection element integrated with a semiconductor power device to achieve convenient layout, better ESD-leakage trade-offs and more scalable to small die size.

2. Description of the Prior Art

Conventional layout for manufacturing semiconductor power devices with protection circuits against electrostatic discharges (ESD) still has a limitation. A general practice is to place the ESD protection circuits on the gate pad. However, such layout significantly limits the scalability of ESD layout on the semiconductor power device when such devices are required to manufacture on different size of dies for different ESD rating protection applications. Such layout further limits the flexibility of modifying the device configurations. The conventional layout designs also limit the ESD ratings due to the fact that the width of ESD protection device has only limited range of adjustment thus limiting the amount of current that can be redirected by the ESD circuit. Generally speaking, high ESD protection, i.e., ESD circuit with high ESD rating, requires wider ESD width. However, when the ESD circuit is disposed on the gate pad, the ESD width is limited by the size of the gate pad while the size of the gate pad is normally kept as small as possible, usually that is a width just right for wire bonding to provide the gate connection.

FIGS. 1A to 1B are circuit diagrams as disclosed by U.S. Pat. Nos. 4,492,974 and 4,831,424 respectively for a one-stage ESD protection circuit and the one-stage protection circuit with a gate resistor Rg. FIG. 1C is a two stages ESD protection circuit with a gate resistor Rg disclosed by U.S. Pat. No. 6,172,383. These ESD protection circuits are formed with a number of Zener diode pairs for ESD protection without and with Rg as that shown in FIGS. 1D and 1E respectively. As discussed above, the size of the gate pad is generally designed just for wire bonding to provide for gate connection, which should be kept as small as possible. Large gate pad size results in small active area of the same device size. Small active area will cause bad device performance, such as high on-resistance, which means high power consumption. In order to achieve the same device performance, die size increase would be necessary, which causes an increase in production cost. Generally speaking, for the same device performance, e.g., the same power consumption and ESD rating, smaller die size generally can achieve a better performance-to-cost ratio.

For these reasons, the size of the gate pad is typically fixed to a certain size such as 150 um×150 um. With a limited gate pad area, there is no room to adjust the ESD layout, e.g., the adjustment of ESD ratings by adjusting the width of the ESD is limited by the gate pad size.

Recently, there are ever increasing demands to overcome such limitations and difficulties because of the facts that more and more high-speed switching devices are now manufactured on smaller dies for portable device applications. Devices supported on a die that has a larger size usually have high ESD rating even without ESD protection due to its big input capacitance (Ciss). In contrast, a device supported on a die that has smaller size has a low input capacitance thus usually resulting in low ESD rating. For these reasons, device supported on smaller die can be destroyed during human handling due to electric static discharge. Therefore, high ESD rating for small die can significantly increase its reliability. However, for the purpose of saving the die areas in a smaller die, the ESD circuits are generally manufactured on the gate pad to expand the active cell areas thus limiting the ESD layout flexibility and also further limiting the ESD protection ratings for the devices supported on the dies of smaller size. For these reasons, there are strong demands to provide the semiconductor power devices with higher ratings of ESD protections and more flexibility in rearranging the device layout with different die sizes. Particularly, for devices supported on dies of smaller die sizes, there still exist a need to further provide new and flexible ESD circuits on the semiconductor power devices such that the above-discussed limitations can be overcome.

Therefore, it is necessary to provide alternate layout for the ESD circuits on the semiconductor power device not limited by the conventional gate pad ESD configuration while improving the ESD ratings. It is also desirable that the new layout can allow more flexibility for scalability such that the ESD protection can be more conveniently integrated with the semiconductor power devices to provide more effective protections such that the above discussed difficulties and limitations can be overcome.

SUMMARY OF THE PRESENT INVENTION

It is therefore an aspect of the present invention to provide a new and improved layout of an ESD protection circuit on a semiconductor power device by forming the ESD protection circuits on the peripheral regions of a semiconductor power device as dopant stripes. The new and improved layout greatly increase the convenience and flexibility of forming the ESD protection circuit with different widths, with different number of stages, with or without interconnected resistors to the gate Rg. The design and configuration further enables improvement of ESD ratings to achieve lower leakage current and better protection performance. A reduce gate leakage current less than 10 μA is achievable. The layout further enables the ESD protection circuit to be conveniently scalable to smaller dies with different flexible alternation of layout designs.

Briefly in a preferred embodiment this invention discloses a semiconductor power device supported on a semiconductor substrate includes a plurality of transistor cells each having a source and a drain with a gate to control an electric current transmitted between the source and the drain. The semiconductor further includes a source metal connected to the source region, and a gate metal configured as a metal band surrounding source region of the power device connected to a gate pad wherein the gate metal and the gate pad (also metal) are separated from the source metal by a metal gap. The semiconductor power device further includes an ESD protection circuit includes a plurality of alternating doped dielectric regions, e.g., doped polysilicon regions, of opposite conductivity types constituting Zener diodes pairs extending across the metal gap and connected between the gate metal and the source metal on the peripheral region of the substrate. In an exemplary embodiment, the ESD protection circuit further includes a number of Zener diode pairs surrounding the gate pad as a separate ESD protection circuit network for the semiconductor power device. In another exemplary embodiment, the pair of doped dielectric regions, e.g., doped polysilicon regions, surrounding the gate pad having a higher breakdown voltage than the ESD protection circuit disposed at the peripheral region away from the gate pad. In another exemplary embodiment, the ESD protection circuit disposed at the peripheral region having a smaller width than the pair of doped dielectric regions, e.g., doped polysilicon regions, surrounding the gate pad for providing a reduced gate leakage current. In another exemplary embodiment, the ESD protection circuit disposed at the peripheral region having a smaller number of pairs of doped regions than the pair of doped dielectric regions, e.g., doped polysilicon regions, surrounding the gate pad for providing a predefined ESD rating. In another exemplary embodiment, the ESD protection circuit disposed on the peripheral region further includes multiple ESD protection stages wherein each stage includes multiple doped dielectric regions, e.g., doped polysilicon regions, as Zener diode regions of opposite conductivity types wherein each of the stages having a different width. In another exemplary embodiment, the ESD protection circuit disposed on the peripheral region further includes multiple ESD protection stages wherein each stage includes multiple doped dielectric regions, e.g., doped polysilicon regions, as Zener diode regions of opposite conductivity types wherein each of the stages having a different number of pairs of doped regions of opposite conductivities. In another exemplary embodiment, the ESD protection circuit disposed on the peripheral region further includes a doped polysilicon strip as a resistor connected between the ESD protection stages to the gate metal on the peripheral region. In another exemplary embodiment, the ESD protection circuit disposed on the peripheral region further includes multiple ESD protection stages wherein a first stage of the ESD protection circuit having a largest number of pairs of the doped dielectric regions, e.g., doped polysilicon regions, as the ESD diodes for reducing a gate leakage current. In another exemplary embodiment, the ESD protection circuit disposed on the peripheral region further includes multiple ESD protection stages wherein each stage includes multiple doped dielectric regions, e.g., doped polysilicon regions, as Zener diode regions of opposite conductivity types wherein the ESD protection circuit further includes a doped dielectric strip, e.g., doped polysilicon strip, as a resistor connected between the multiple ESD protection stages. In another exemplary embodiment, the ESD protection circuit further includes pairs of doped dielectric regions, e.g., doped polysilicon regions, surrounding the gate pad as a separate ESD protection circuit network wherein the separate ESD protection circuit network further includes a second ESD protection stage includes a plurality of doped dielectric regions, e.g., doped polysilicon regions, extending from the source metal across the metal gap to the gate metal on a bottom peripheral region opposite a top peripheral region.

This invention further discloses a method for protecting a semiconductor power device supported on a semiconductor substrate from an ESD pulse. The method includes a step of forming an ESD protection circuit with at least two ESD protection stages by including in each stage a plurality of doped polysilicon regions of opposite conductivity types for functioning as ESD diodes extending between a gate metal and a source metal on a peripheral region of the substrate wherein a first ESD protection stage. The method further includes a step of forming a first ESD protection stage with a width based on a predefined ESD rating and forming a last ESD protection stage with a smallest number of pairs of doped dielectric regions among the multiple ESD protection stages based on a predefined gate leakage current. In an exemplary embodiment, the method further includes a step of protecting a thin gate oxide layer by forming a number of pairs of doped dielectric regions at the periphery region as a separate ESD protection circuit network having a lowest breakdown voltage among the multiple ESD protection stages. In another exemplary embodiment, the method further includes a step of forming at least another ESD protection stage in the separate ESD protection circuit network by forming a plurality of doped dielectric region as Zener diodes pairs disposed on a bottom peripheral of the semiconductor substrate.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
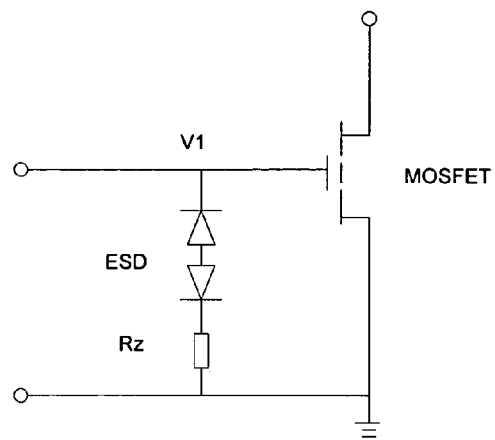
FIGS. 1A to 1E are circuit diagrams and top views of MOSFET device with one and two stages of ESD protection circuits according to conventional layout of the MOSFET device protected by the ESD protection circuits.
Figure 1B:
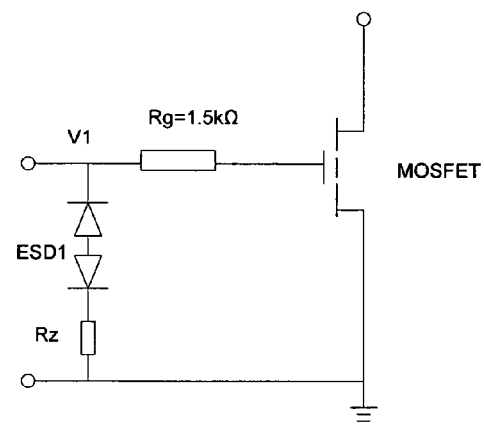
Figure 1C:
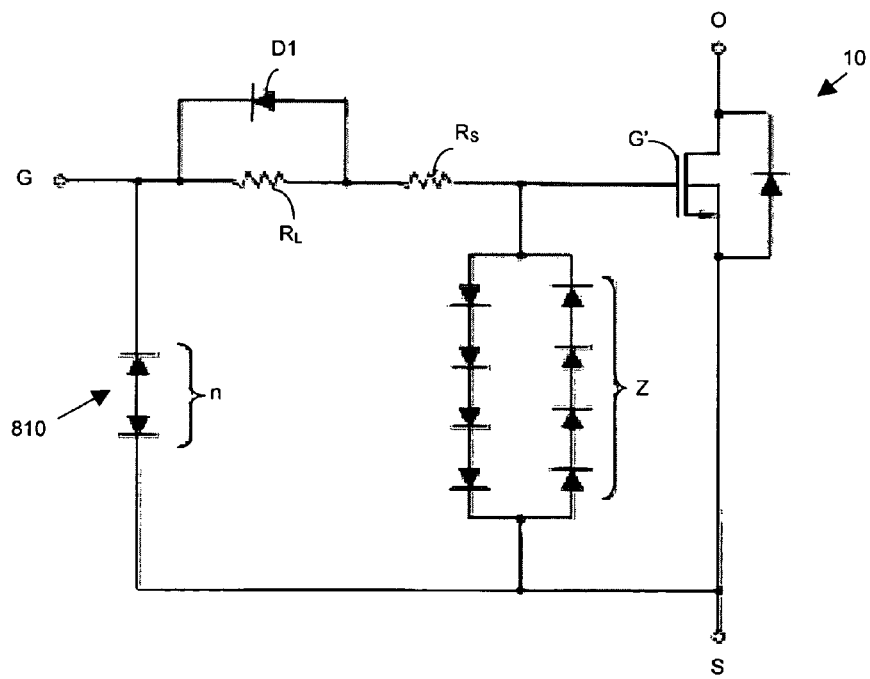
Figure 1D:
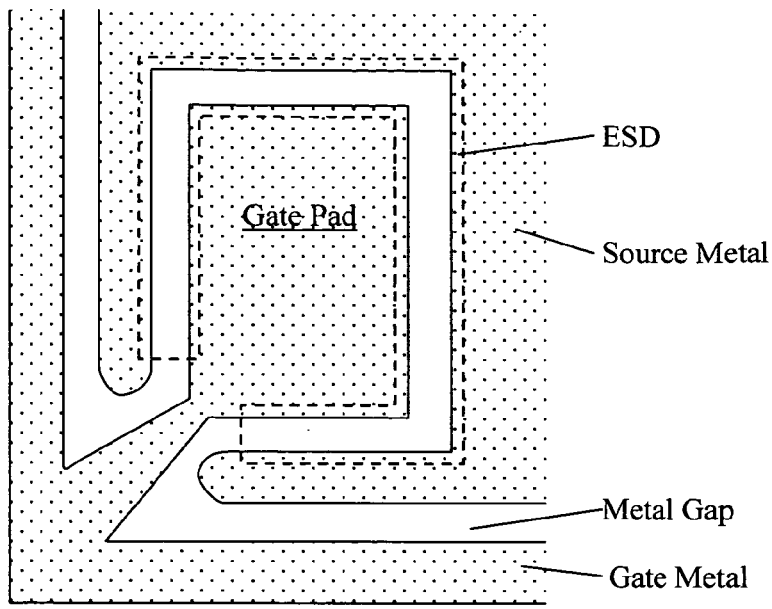
Figure 1E:
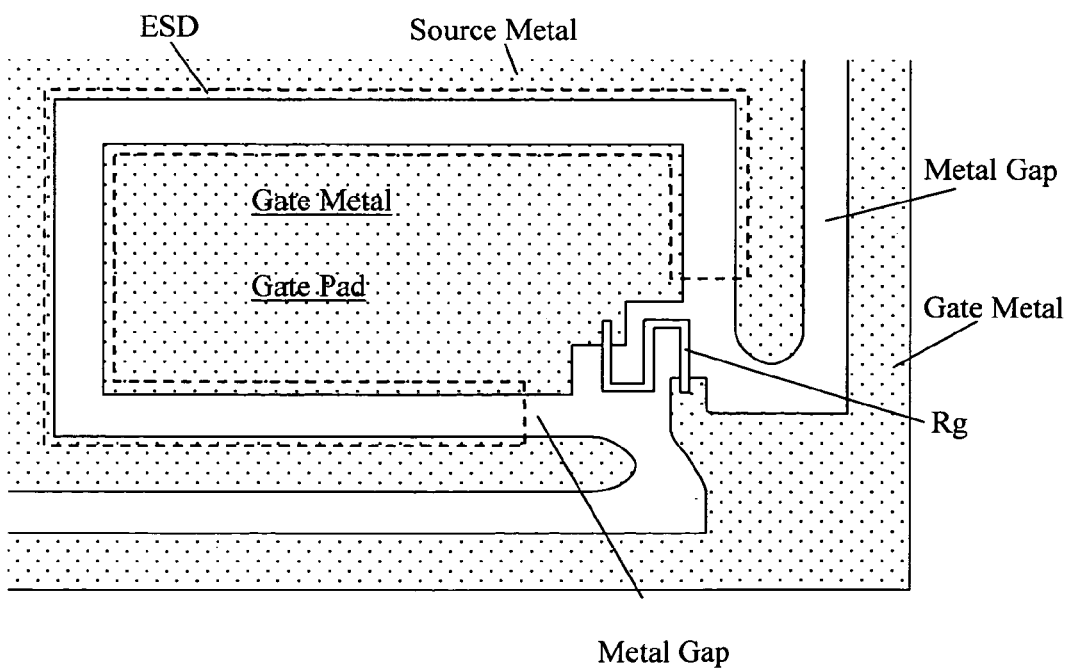
Figure 2A:
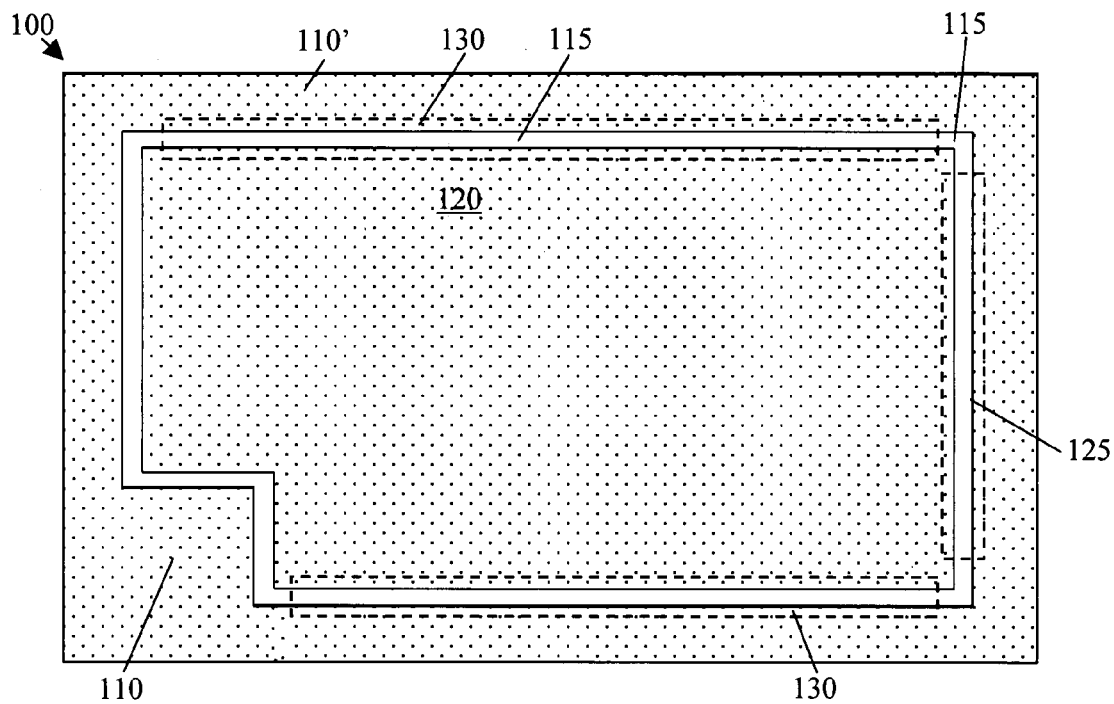
FIGS. 2A and 2B are a top view and an explosive view of a corner of the top view respectively for a ESD protected MOSFET device of this invention with the ESD protection circuits formed as doped stripes on the peripheral regions.
Figure 2B:
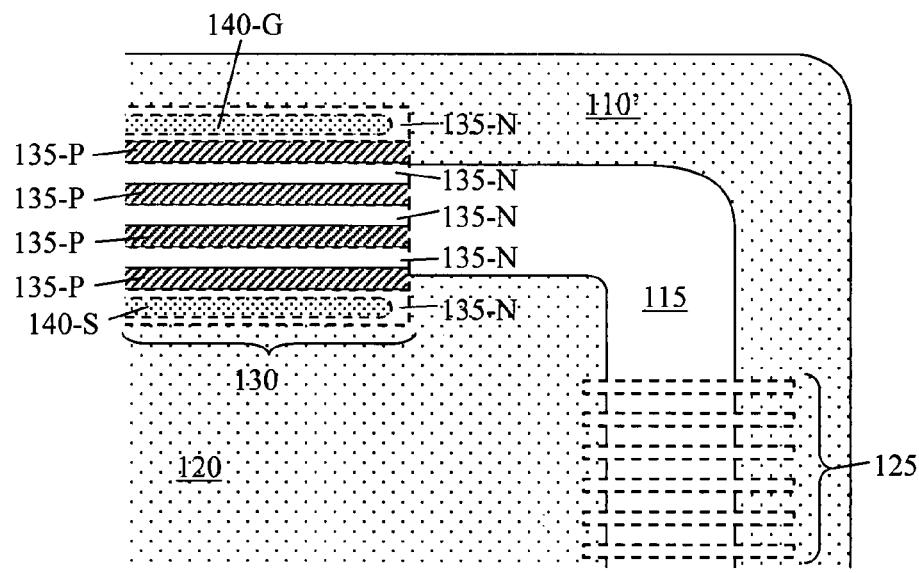

Referring to FIGS. 2A and 2B for a top view and a partial explosive view of a portion of the top view of a semiconductor power device, e.g., a MOSFET device 100, of this invention. The MOSFET device 100 includes a gate pad 110 with extended gate metal 110' disposed on the peripheral edges of the device and a source contact metal 120. There is a metal gap 115 opened between the source metal 120 and the gate pad 110 and gate metal 110'. The peripheral ESD protection circuit 130 is disposed on the peripheral of the semiconductor power device. As more clearly shown in the explosive view in FIG. 2B, the peripheral ESD circuit is formed to extend from the gate metal 110' perpendicularly crossing over the metal gap 115 to reach the outer edges of the source metal 120. The peripheral ESD circuit 130 includes a plurality of P-stripes 135-P next to N-stripes 135-N with an ESD gate metal contact 140-G and an ESD source metal contact 140-S disposed on the gate metal 110' and the source 120 to form the Zener diodes. In this example, there are four Zener diode pairs. On the right side of the device peripheral are also a plurality of trench terminations 125 as gate runners extending from the active cell area covered under the source metal to the gate metal 110' disposed on the right edge of the device for connecting the gate metal 110' to the gate in the active cell area.

Figure 3A:
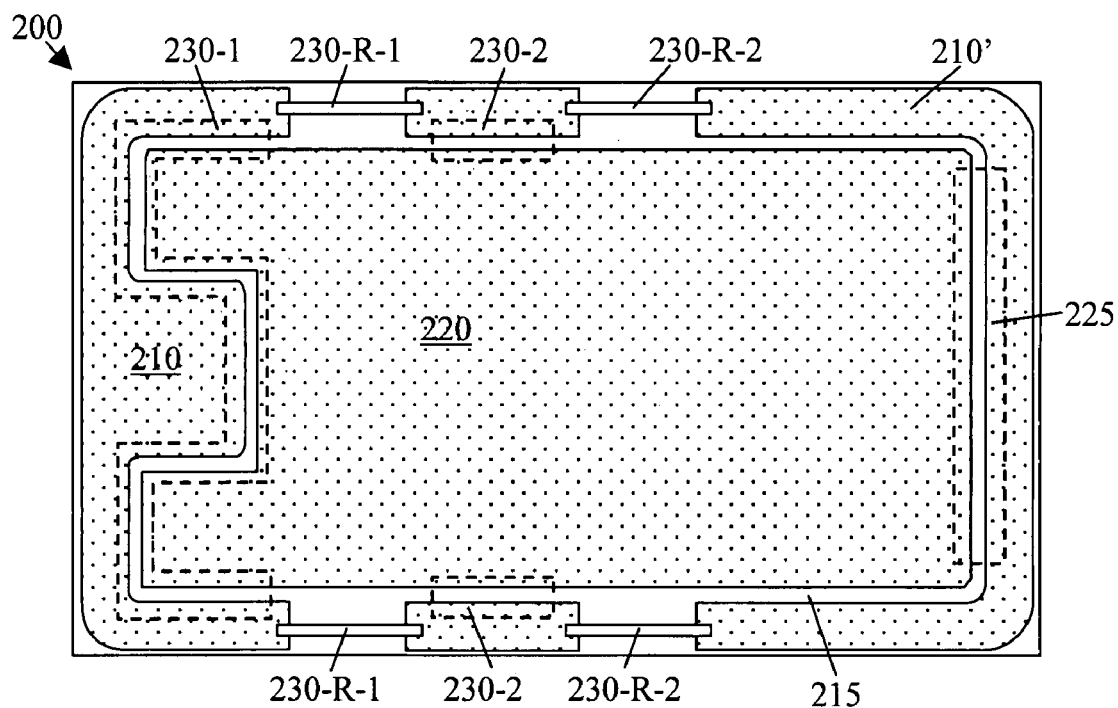
FIGS. 3A, 3B and 3C are a top view, a two stage ESD circuit diagram, and an explosive view of a corner of the top view respectively for an ESD protected MOSFET device of this invention with the two stage ESD protection circuits formed as doped stripes on the top peripheral regions and around the gate pad and the bottom peripheral region on the bottom.
Figure 3B:
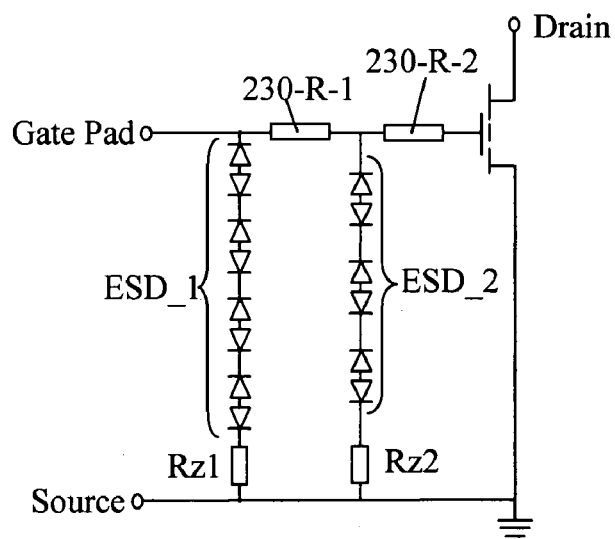
Figure 3C:
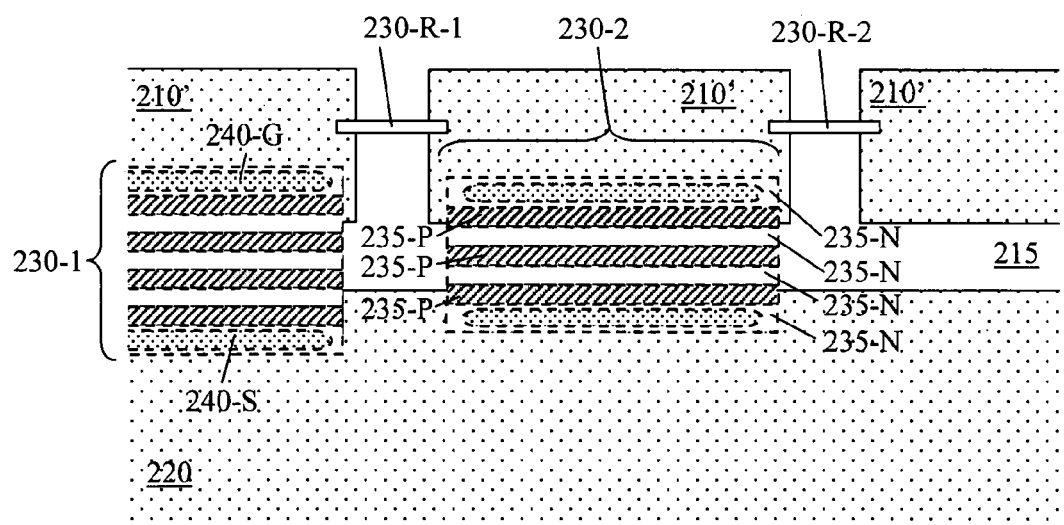

Referring to FIG. 3A to 3C for another embodiment of a semiconductor power device 200 implemented with two stages of ESD protection circuits, e.g., ESDP_1 230-1 and ESDP_2 230-2 with two correspondent gate resistors, i.e., Rg1 230-R-1 and Rg2 230-R-2, disposed on the peripheral of the device. FIG. 3A is a top view of the MOSFET device 200 that includes a gate pad 210 with extended gate metal 210' and a source metal contact 220 with a metal gap 215 disposed between them. FIG. 3A shows a top network of peripheral ESD protection circuit and a bottom network of peripheral ESD protection circuits. Each of the top and bottom network ESD protection circuits includes two stages of ESD protection circuits shown as ESDP_1 230-1 and ESDP_2 230-2 (though they share ESDP_1) each connected to a gate resistor Rg1 230-R-1 and Rg2 230-R-2 and Zener parasitic resistors Rz1 and Rz2 respectively as shown in FIG. 3B. Referring to FIG. 3C, each of these peripheral ESDP circuits 230-1 and 230-2 is formed to cross over the metal gap 215 having a width w1 and w2 respectively wherein the width is measured along the gate metal 210'. Each of these peripheral ESDP circuits 230-1 (ESDP_1) and 230-2 (ESDP_2) includes a plurality Zener diode pairs each including a pair of P-doped region 235-P next to N-doped region 235-N with an ESDP gate metal contact 240-G and an ESDP source metal contact 240-S disposed on the gate metal 210' and the source 220. The gate resistor Rg1 230-R-1 is connected between the first and the second ESDP circuits 230-1 and 230-2 and the second gate resistor Rg2 230-R-2 is connected between ESDP_2 to the gate metal 210' leading to the trench terminations 225. As shown in FIGS. 3B and 3C, the resistor Rg2 230-R-2 can be conveniently integrated with the peripheral ESDP_2 designed to reduce the node voltage at the gate for protecting gate from a gate oxide damage during an ESD voltage pulse. Thus, the reduction of the gate voltage during ESD event further improved the ESD protection function. As shown in FIG. 3A, two ESDP networks, i.e., a top ESDP network and a bottom ESDP network, are implemented with the top and bottom ESDP networks connected in parallel to the gate pad 220 thus enable the ESD protection circuits to dissipate the ESD pulse even more effectively. The first bottom ESDP_1 protection circuit is disposed immediately around the gate pad 210 that has wider width such that ESDP_1 has a lower parasitic Zener diode resistance to protect the thin gate oxide more effectively.

For an ESD protection circuit that includes two stages of Zener diodes as shown in FIG. 3A to 3C, the leakage current can be expressed as Equation 1 as set forth below:

$$Igss = \eta\sigma\left(\frac{w_1}{m} + w_2\right) \quad (1)$$

Where Igss is the leakage current, $\eta$ is manufacturing process related parameter; $\sigma$ is the conductivity of the ESDP polysilicon; w1 is the ESDP_1 width; w2 is the ESDP_2 width; and m is the leakage current ratio of ESDP_2 against ESDP_1. Throughout this text, the width is measured parallel to the gate metal 210'. The greater the ratio of Zener diode pairs in ESDP_1 versus the Zener diode pairs in ESDP_2, the greater is the ratio m. For example, when ESDP_1 has 3 Zener diode pairs and ESDP_2 has 2, and both stages have the same width and are tested at 10V, their leakage current ratio, m, is about 8, which minimizes the effect of w1 on Igss. This formula shows Igss leakage prediction for two-stage ESD.

The ESD protection rating can be represented as Equation 2 as set forth below:

$$ESD = \frac{\sigma t}{3L}(32w_1 + w_2) \quad (2)$$

Where ESD represents an ESD protection rating for the two-stage ESDP. $\sigma$ is the conductivity of ESDP poly; t is the ESDP poly thickness; L is the length perpendicular to the gate metal 210' of the doped ESDP region of the Zener diode. It is in the direction of electric flow when an ESD pulse redirects from the gate metal to the source metal through the ESDP (whereas the width is in the direction of electric flow during normal operation, along gate metal 210'). In Equations 1 and 2, w1 is ESDP_1 width; w2 is the ESDP_2 width. Equations 1 and 2 clearly show that an increase in ESDP_1 width will increase the ESD protection rating. The Igss formula shows that by reducing ESDP_2 width will reduce Igss leakage. These two formulae provide design guidance for the ESDP layout.

Therefore, according to the disclosures made in this invention, multiple stages of ESD protection circuits are implemented with ESD protection of high ESD protection rating, e.g., an ESDP_1 formed with a wider width, is disposed near a gate pad of the MOSFET. The ESD protection circuit with low breakdown voltage is near the gate to provide more effective and immediate protection to a gate with thin gate oxide. The ESDP_1 has more doped region pairs to provide more Zener diode pairs to reduce the gate leakage current as shown in equation (1) and will be further discussed in FIG. 5 below. An ESD protection circuit with high ESD protection rating with greater width is formed around the gate pad, to effectively dissipate the ESD pulses.

According to above descriptions, the width of the ESD protection circuit that is closest to the gate pad, e.g., ESDP_1, provides a critical dimension for determining the ESD protection rating while the Igss leakage is determined by the number of the ESD Zener diode pairs of the protection circuit and a small ESDP_2 width. These principles can be applied to ESD protection circuits with any number n stages. The range and distribution of the ESD protection ratings between the ESDP_1 and the ESDP_n are designed for dissipation ESD pulse efficiently, since Zener diode pairs do not conduct much current below its breakdown voltage.

Figure 4A:
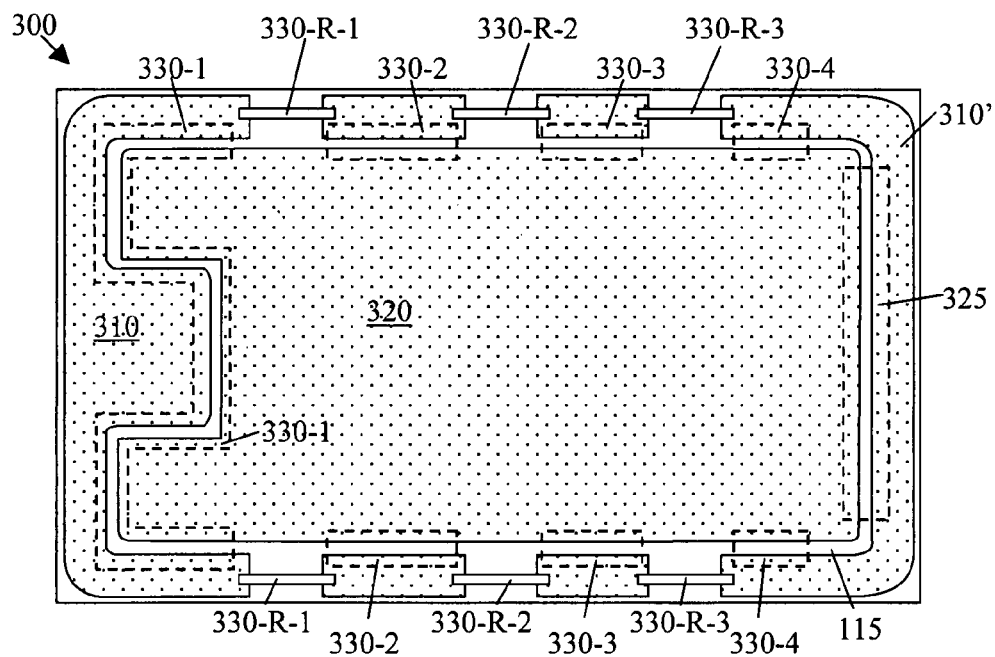
FIGS. 4A and 4B are a top view and an explosive view of a corner of the top view respectively for a ESD protected MOSFET device of this invention with multiple stage ESD protection circuits formed as doped stripes on the peripheral regions with top and bottom ESD network circuits for more effectively dissipating an ESD pulse.
Figure 4B:
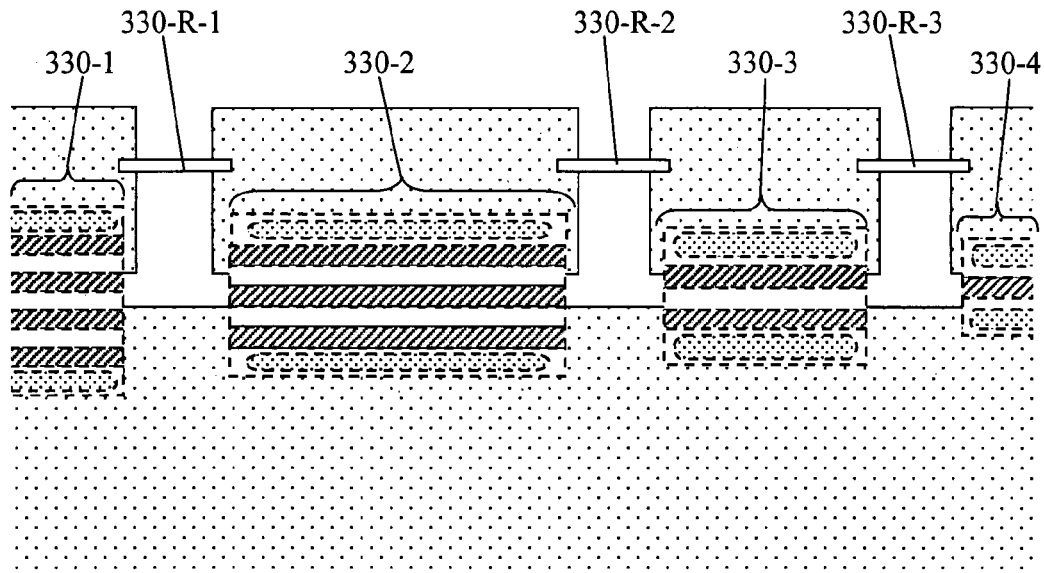

Referring to FIGS. 4A and 4B for a third exemplary embodiment of a semiconductor power device 300 implemented with four stages of ESD protection circuits, e.g., ESDP_1 330-1, ESDP_2 330-2, ESDP_3 330-3, and ESDP_4 330-4 with three correspondent gate resistors, i.e., Rg1 330-R-1, Rg2 330-R-2, and Rg3 330-R-3, disposed on the peripheral of the device. Following the principles used for the two-stage ESD protection circuit, ESDP_1 330-1 has the largest width and the most Zener diode pairs, and each successive stage has a smaller width and fewer Zener diodes pairs than the stage before. FIG. 4A shows a top view of the MOSFET device 300 that includes a gate pad 310 and a source metal contact 320 with peripheral ESD protection stages shown as ESDP_1, ESDP_2, ESDP_3, and ESDP_4, each connected to a gate resistor, Rg1 330-R-1, Rg2 330-R-2, and Rg3 330-R-3 with detail implementation shown in FIG. 4B. Also shown in FIG. 4A is a bottom network of ESD protection stages ESDP_2 330-2 and ESDP_3 330-3 and ESDP_4 330-4 formed at the bottom edge of the MOSFET device and operates in parallel with the top network. Referring to FIG. 4B, that shows similar layout and structural configurations as that shown in FIG. 3B wherein the ESD protection circuit ESD_4 330-4 that has the least number of stripes is disposed near the trench terminations 325 thus provides best protection for the gate while limiting the leakage current. The ESDP_1 330-1, with the highest number of stripes with most numerous Zener diodes, is disposed away from the gate thus providing high ESD protection rating without adversely affecting the leakage current. In this exemplary embodiment, there is an ESDP_4 330-4, but there is no corresponding Rg4. The final Rg resistor, Rg_n, may or may not be included, depending on the design of the circuit.

Figure 5:
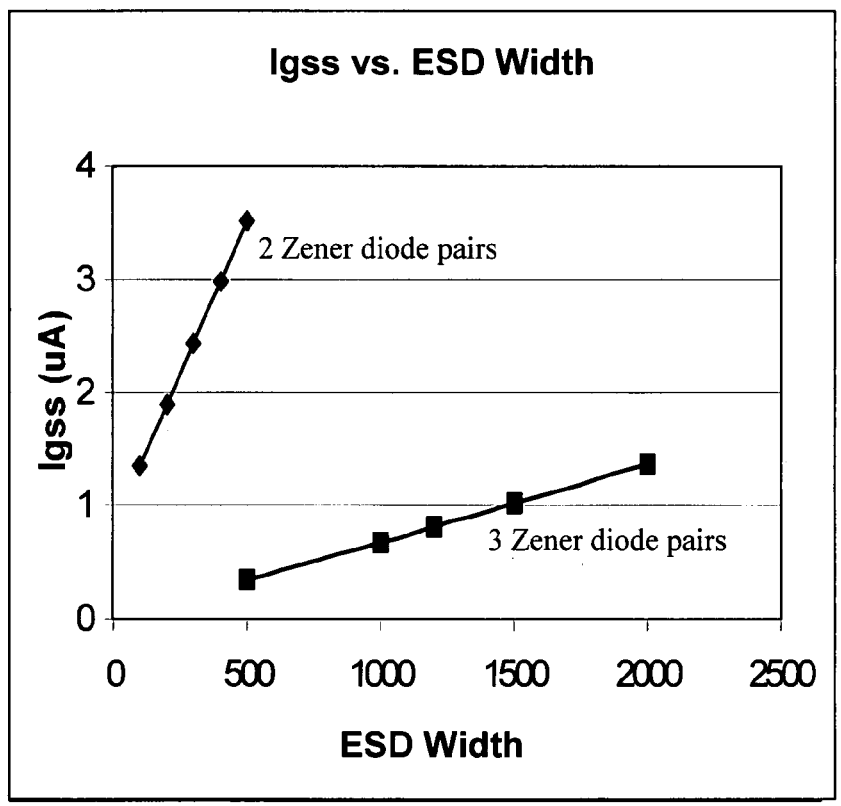
FIG. 5 is a diagram for showing the gate leakage current as function of the ESD protection circuit width. The trends are shown for different numbers of the ESD Zener diode pairs formed as implanted stripes of this invention.

Referring to FIG. 5 for a diagram that plots gate leakage currents Igss as function of the ESDP width for the two and three-Zener-diode-pair ESD protection circuits, based on experimental results. FIG. 5 shows the Zener diode leakage current Igss for the separate ESDP circuits of the same width with two and three Zener diode pairs at the gate voltage of 10V. The Zener diode leakage current will contribute overall Igss in the die. FIG. 5 clearly shows that a high number of Zener diode pairs has low leakage current as compared to a low number of Zener diode pairs at the same gate voltage. Equation (1) demonstrates that the first stage should have more Zener diode pairs than the second (to minimize the effect of ESDP_1's width) and that the width of ESDP_2 should be small. Equation (2) shows that a wide ESDP_1 width improves the ESD rating.

Figure 6A:
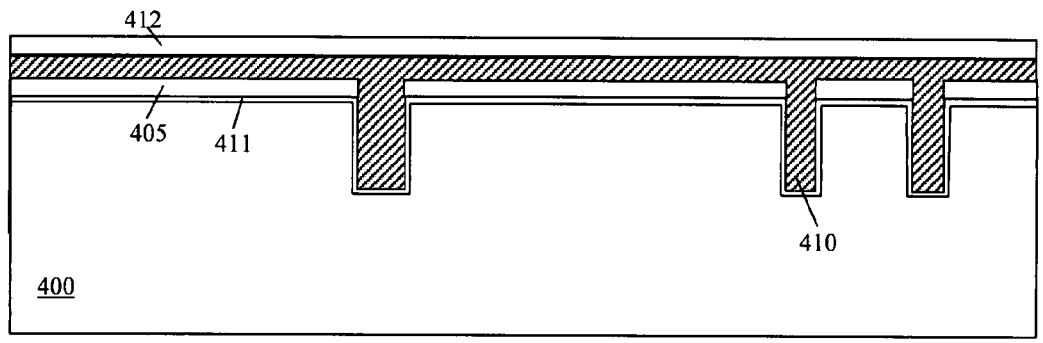
FIGS. 6A to 6N are a serial of side cross sectional views of a MOSFET device for showing the manufacturing processes for forming the ESD protection circuits as doped stripes on the peripheral region of the MOSFET device.
Figure 6B:
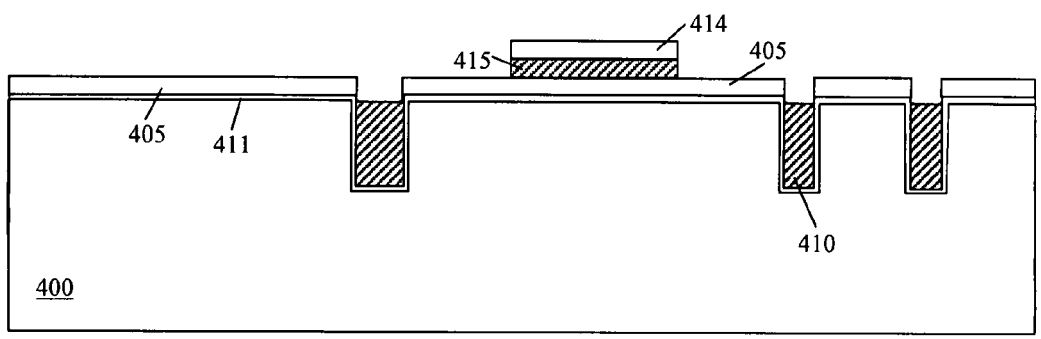
Figure 6C:
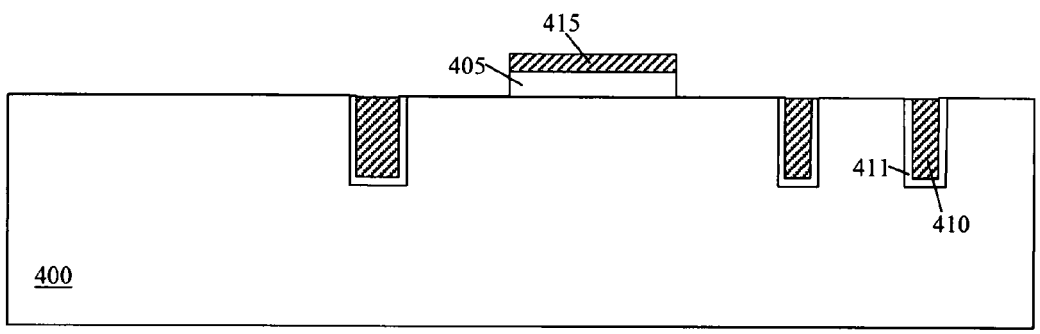
Figure 6D:
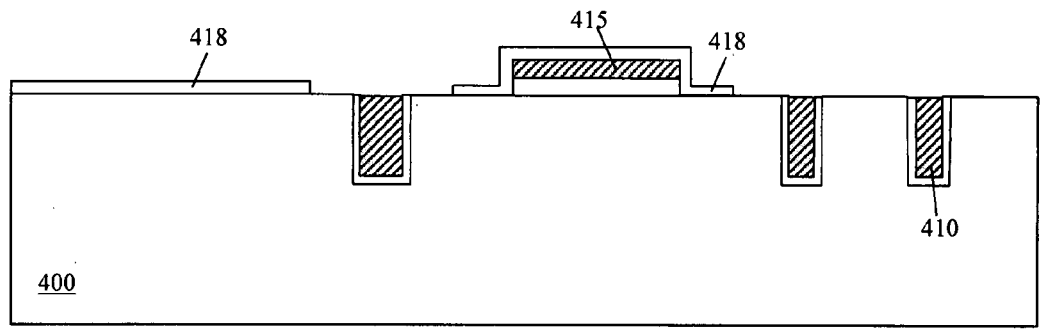
Figure 6E:
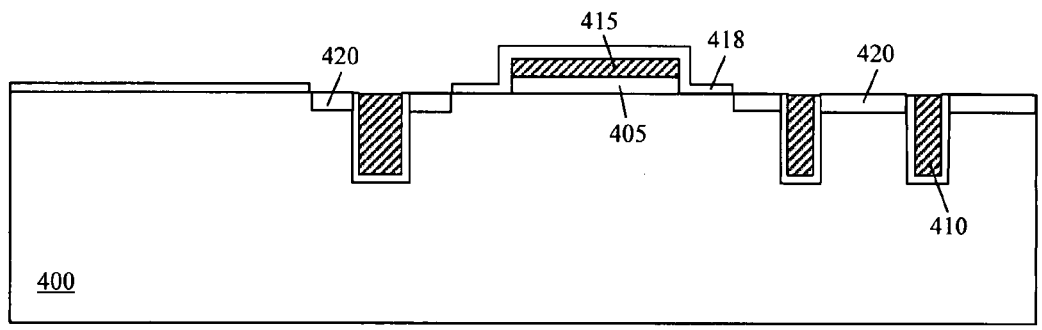
Figure 6F:
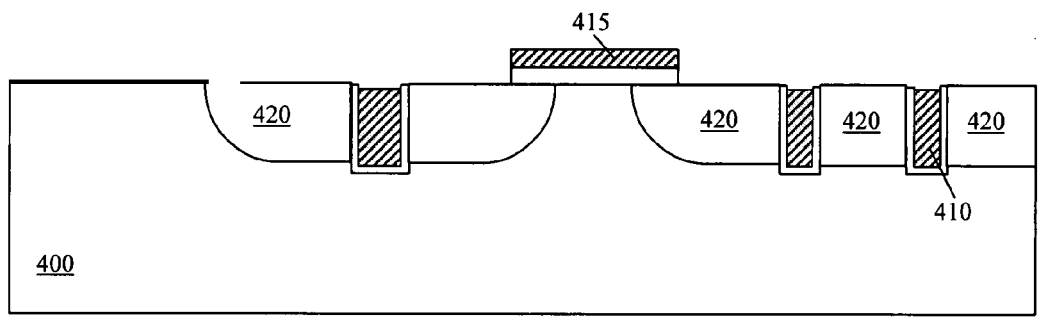
Figure 6G:
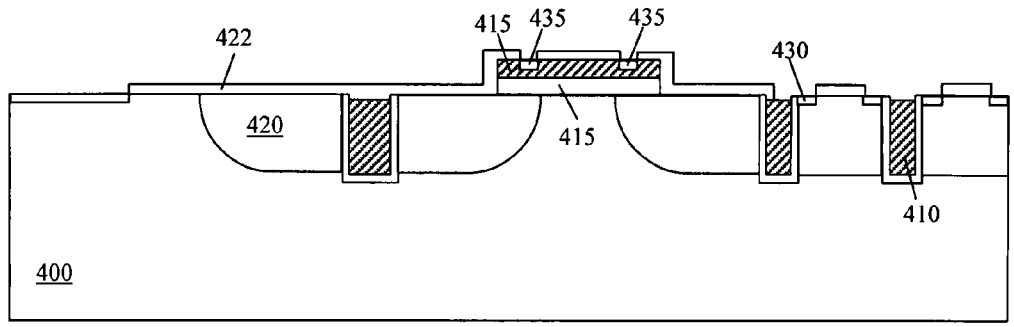
Figure 6H:
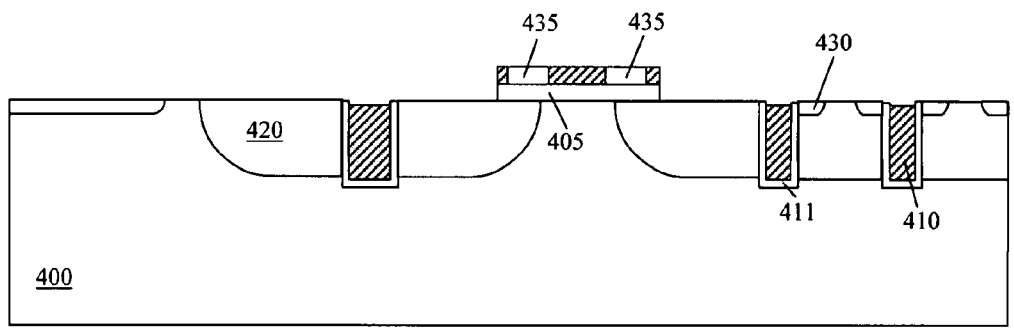
Figure 6I:
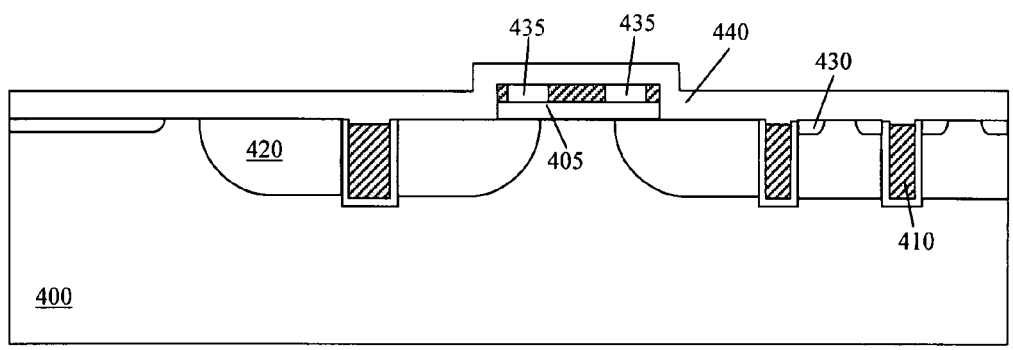
Figure 6G:
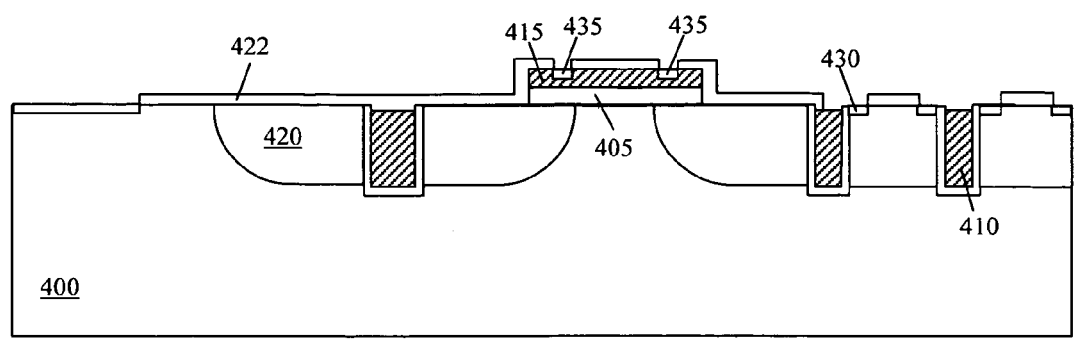
Figure 6J:
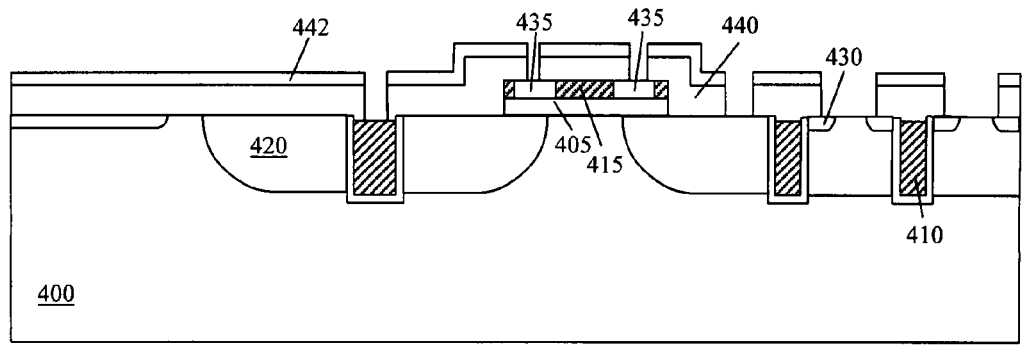
Figure 6K:
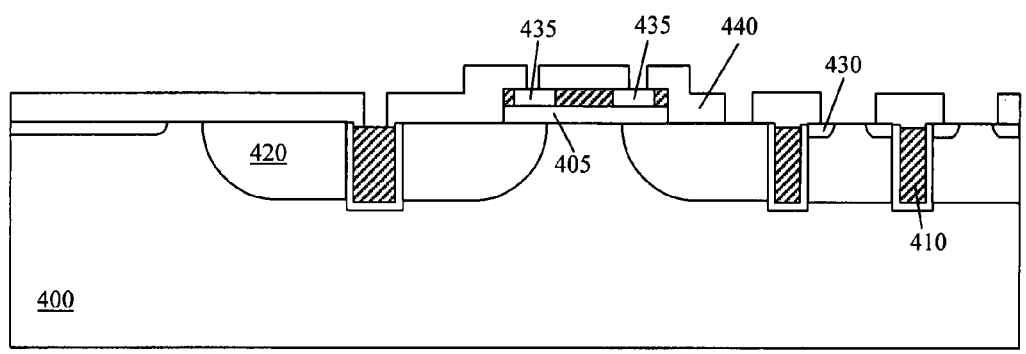
Figure 6L:
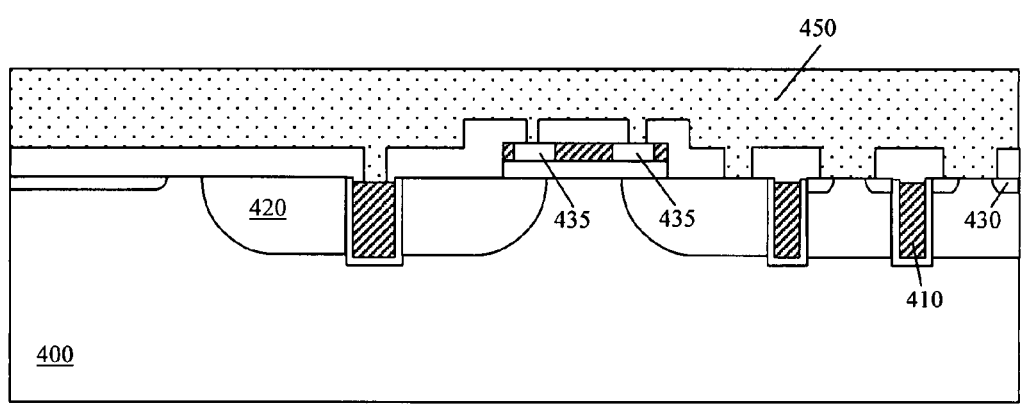
Figure 6M:
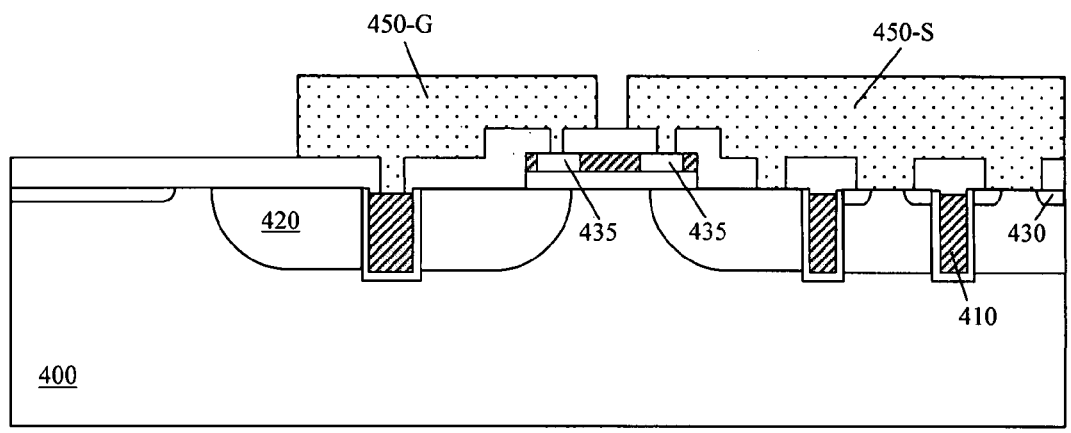
Figure 6N:
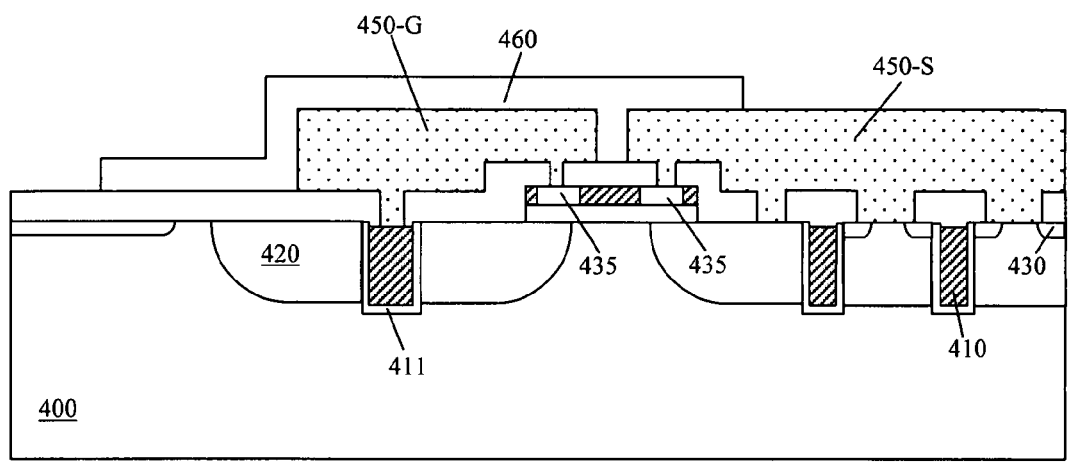

Referring to FIGS. 6A to 6M for a series of side cross sectional views for illustrating the manufacturing process of the MOSFET device with peripheral ESD protection circuits. The process starts with a semiconductor substrate, e.g., a silicon substrate 400 with oxide layer 405 situated on top of it. Both are etched to open a plurality of trenches. A thin oxide layer 411 is grown from the substrate 400. The trenches are then filled with polysilicon 410 therein to function as trenched gates with closer distances between the trench gate in an active cell area and greater distance between the trench gate in a termination area near the peripheral edge of the substrate 400. The polysilicon is lightly doped by a background implant. An oxide layer 412 is deposited on top of the polysilicon layer as shown in FIG. 6A. In FIG. 6B, an oxide mask and etch is carried out to leave a small remnant of oxide layer 412 which acts as a mask for a polysilicon etch that leaves a corresponding portion of the polysilicon layer 410 and the polysilicon in the trenches. In FIG. 6C, an oxide etch removes the residual oxide layer 412, and also most of oxide layer 405 to form the stacked polysilicon regions 415. The thin oxide layer 411, is also removed in the etch, except in the trenches where it will serve as the gate oxide, and under the stacked oxide-polysilicon layer 415, where it now will be regarded as part of the stacked layer. In FIG. 6D, a body mask 418 is applied and in FIG. 6E, a body implant with body dopant is carried out to form the body regions 420. In FIG. 6F, the body mask 418 is removed and a body diffusion is processed to diffuse the body regions 420 into the substrate 400. In FIG. 6G, a source and ESDP implant mask 422 is applied to implant the source regions 430 and the ESDP dopant regions 435 in the polysilicon layer at the top of the oxide-polysilicon stacked layer 415. In FIG. 6H, the source and ESD mask 422 is removed and a source diffusion process is carried out to diffuse the source region 430 into the substrate 400 and ESDP dopant regions 435 into the oxide-polysilicon stacked layer 415. In FIG. 6I, an insulation composed of BPSG layer 440 is formed covering the top surface and in FIG. 6J, a contact mask 442 is applied to open contact openings through the BPSG insulation layer 440. In FIG. 6K, a contact dopant implant is processed to form contact dopant regions beneath each contact openings opened through the BPSG insulation layer 440 followed by a metal deposition of a metal layer 450 as shown in FIG. 6L. In FIG. 6M, the process proceeds with the patterning of the metal layer 450 into gate pad 450-G and source contact metal 450-S with the gate pad and the source metal further in electric contact with the doped ESD protection stripes formed in the stacked oxide-polysilicon layer 415 with source doped regions 435 formed in the polysilicon layer. In this figure, there is only one Zener diode pair. In FIG. 6N, the manufacturing processes are completed with the formation of a passivation layer 460 covering and protecting the device over the top surface of the MOSFET device.

A new and improved ESD protection circuit configuration and layout are disclosed in this invention by forming the ESD protection circuit as dopant stripes on the peripheral regions of the semiconductor power device. Multiple ESDP stages on the peripheral regions as shown can be conveniently formed. There are flexibilities to form ESD protection circuit with different width to achieve different ESD protection requirements. The processes also allow for scalability to small dies and can be flexibly manufactured with or without a gate resistor Rg. With the flexibility of the manufacturing processes, it is more convenient to achieve low gate leakage and high ESD protection rating. Furthermore, two ESDP networks can be conveniently formed on the MOSFET device by manufacturing the MOSFET device with a top and bottom ESD protection circuit networks as shown in FIGS. 2, 3 and 4 above.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, other conductive material instead of polysilicon may be used. The technique can apply to both N/P type MOSFETs and LDD MOSFETs. Accordingly, it is intended that the appended claims be interpreted as covering all alterations and modifications as fall within the true spirit and scope of the invention.

We claim:

1. A semiconductor power device supported on a semiconductor substrate comprising a plurality of transistor cells each having a source and a drain with a gate to control an electric current transmitted between the source and the drain, wherein the semiconductor power device further comprising:

a source metal connected to said source, and a gate metal configured as a metal band extended from a gate pad surrounding a peripheral region of said semiconductor substrate connected to a gate pad wherein said gate metal and said gate pad are separated from said source metal by a metal gap;

an ESD protection circuit comprising a plurality of alternating doped polysilicon regions of opposite conductivity types extended as parallel straight strip segments parallel to said metal band constituting Zener diodes extending across said metal gap and having at least an outermost straight strip segment disposed directly under said gate metal the parallel strip segments contact an inner of said gate metal and at least an innermost straight strip segment opposite said outermost straight strip segment disposed directly under the source metal and the parallel strip segments contact an outer edge of said source metal wherein said Zener diodes disposed on a top surface of said semiconductor substrate near said peripheral region of said semiconductor substrate;

said ESD protection circuit further comprises a first set of said doped polysilicon regions extended as said parallel straight strip segments constituting a first set of said Zener diodes along edges of said gate pad as a first stage of said ESD protection circuit and said ESD protection circuit further comprises a second set of doped polysilicon regions extended as said parallel straight strip segments constituting a second set of Zener diodes as a second stage of said ESD protection circuit wherein each of said first and second stages having the outermost straight strip segment disposed directly under and the parallel strip segments contact the inner edge of the gate metal disposed at said peripheral region away from said gate pad; and said first stage of said ESD protection circuit is disposed on edges of said gate pad having a width perpendicularly across said first set of doped polysilicon regions extended as the parallel straight strip segments greater than a width perpendicularly across said second set of doped polysilicon regions extended as the parallel straight strip segments of said second stage of said ESD protection circuit disposed at said peripheral region away from said gate pad.

2. A semiconductor power device supported on a semiconductor substrate comprising a plurality of transistor cells each having a source and a drain with a gate to control an electric current transmitted between the source and the drain, wherein the semiconductor power device further comprising:

a source metal connected to said source, and a gate metal configured as a metal band extended from a gate pad surrounding a peripheral region of said semiconductor substrate connected to a gate pad wherein said gate metal and said gate pad are separated from said source metal by a metal gap;

an ESD protection circuit comprising a plurality of alternating doped polysilicon regions of opposite conductivity types extended as parallel straight strip segments parallel to said metal band constituting Zener diodes extending across said metal gap and having at least an outermost straight strip segment disposed directly under said gate metal the parallel strip segments contact an inner of said gate metal and at least an innermost straight strip segment opposite said outermost straight strip segment disposed directly under the source metal and the parallel strip segments contact an outer edge of said source metal wherein said Zener diodes disposed on a top surface of said semiconductor substrate near said peripheral region of said semiconductor substrate;

said ESD protection circuit further comprises a first set of said doped polysilicon regions extended as said parallel straight strip segments constituting a first set of said Zener diodes along edges of said gate pad as a first stage of said ESD protection circuit and said ESD protection circuit further comprises a second set of doped polysilicon regions extended as said parallel straight strip segments constituting a second set of Zener diodes as a second stage of said ESD protection circuit wherein each of said first and second stages having the outermost straight strip segment disposed directly under and the parallel strip segments contact the inner edge of the gate metal disposed at said peripheral region away from said gate pad; and said first stage of said ESD protection circuit is disposed along edges of gate pad having a higher number of the parallel straight strip segments constituting a first set of Zener diodes than said second set of said doped regions extended as said parallel straight strip segments of said second stage of said ESD protection circuit disposed on said peripheral region away from said gate pad.

3. A semiconductor power device supported on a semiconductor substrate comprising a plurality of transistor cells each having a source and a drain with a gate to control an electric current transmitted between the source and the drain, wherein the semiconductor power device further comprising:

a source metal connected to said source, and a gate metal configured as a metal band extended from a gate pad surrounding a peripheral region of said semiconductor substrate connected to a gate pad wherein said gate metal and said gate pad are separated from said source metal by a metal gap;

an ESD protection circuit comprising a plurality of alternating doped polysilicon regions of opposite conductivity types extended as parallel straight strip segments parallel to said metal band constituting Zener diodes extending across said metal gap and having at least an outermost straight strip segment disposed directly under said gate metal the parallel strip segments contact an inner of said gate metal and at least an innermost straight strip segment opposite said outermost straight strip segment disposed directly under the source metal and the parallel strip segments contact an outer edge of said source metal wherein said Zener diodes disposed on a top surface of said semiconductor substrate near said peripheral region of said semiconductor substrate;

said ESD protection circuit further comprises a first set of said doped polysilicon regions extended as said parallel straight strip segments constituting a first set of said Zener diodes along edges of said gate pad as a first stage of said ESD protection circuit and said ESD protection circuit further comprises a second set of doped polysilicon regions extended as said parallel straight strip segments constituting a second set of Zener diodes as a second stage of said ESD protection circuit wherein each of said first and second stages having the outermost straight strip segment disposed directly under and the parallel strip segments contact the inner edge of the gate metal disposed at said peripheral region away from said gate pad; and said second stage of said ESD protection circuit disposed at said peripheral region away from said gate pad having a smaller number of said doped polysilicon regions extended as the parallel straight strip segments than a number of said first set of said doped regions extended as said parallel straight strip segments of said first stage of said ESD protection circuit disposed around edges of said gate pad for protecting a thin gate oxide.

4. A semiconductor power device supported on a semiconductor substrate comprising a plurality of transistor cells each having a source and a drain with a gate to control an electric current transmitted between the source and the drain, wherein the semiconductor power device further comprising:

a source metal connected to said source, and a gate metal configured as a metal band extended from a gate pad surrounding a peripheral region of said semiconductor substrate connected to a gate pad wherein said gate metal and said gate pad are separated from said source metal by a metal gap;

an ESD protection circuit comprising a plurality of alternating doped polysilicon regions of opposite conductivity types extended as parallel straight strip segments parallel to said metal band constituting Zener diodes extending across said metal gap and having at least an outermost straight strip segment disposed directly under said gate metal the parallel strip segments contact an inner of said gate metal and at least an innermost straight strip segment opposite said outermost straight strip segment disposed directly under the source metal and the parallel strip segments contact an outer edge of said source metal wherein said Zener diodes disposed on a top surface of said semiconductor substrate near said peripheral region of said semiconductor substrate; and said ESD protection circuit disposed on said peripheral region further comprising multiple ESD protection stages wherein each stage comprising multiple doped polysilicon regions of opposite conductivity types extended as the parallel straight strip segments disposed on said top surface of said semiconductor substrate across said metal gap having at least a first of said parallel straight strip segments disposed directly under said gate metal and the parallel strip segments contact an inner edge of said gate metal and a last of said parallel straight strip segments opposite said first of said parallel straight strip segments disposed directly under said source metal and the parallel strip segments contact an outer edge of said source metal constituting multiple Zener diodes wherein each of said stages having a different width perpendicularly across said parallel straight strip segments of said doped polysilicon regions.

5. The semiconductor power device of claim 4 wherein:
said ESD protection circuit disposed on said peripheral region further comprising a doped polysilicon strip as a resistor disposed on said top surface of said semiconductor substrate connected between said first and second ESD protection stages comprising said doped polysilicon regions extended as the parallel straight strip segments disposed across the source metal and said metal band of said gate metal on said peripheral region.

6. A semiconductor power device supported on a semiconductor substrate comprising a plurality of transistor cells each having a source and a drain with a gate to control an electric current transmitted between the source and the drain, wherein the semiconductor power device further comprising:
a source metal connected to said source, and a gate metal configured as a metal band extended from a gate pad surrounding a peripheral region of said semiconductor substrate connected to a gate pad wherein said gate metal and said gate pad are separated from said source metal by a metal gap;
an ESD protection circuit comprising a plurality of alternating doped polysilicon regions of opposite conductivity types extended as parallel straight strip segments parallel to said metal band constituting Zener diodes extending across said metal gap and having at least an outermost straight strip segment disposed directly under said gate metal the parallel strip segments contact an inner of said gate metal and at least an innermost straight strip segment opposite said outermost straight strip segment disposed directly under the source metal and the parallel strip segments contact an outer edge of said source metal wherein said Zener diodes disposed on a top surface of said semiconductor substrate near said peripheral region of said semiconductor substrate; and
said ESD protection circuit disposed on said peripheral region further comprising multiple ESD protection stages wherein each stage comprising multiple doped polysilicon regions of opposite conductivity types extended as the parallel straight strip segments disposed on said top surface of said semiconductor substrate across said metal gap constituting multiple Zener diodes wherein each of said stages having different number of said parallel straight strip segments of said doped polysilicon regions of alternating conductivity types constituting multiple Zener diodes.

7. The semiconductor power device of claim 6 wherein:
said ESD protection circuit disposed on said peripheral region further comprises multiple ESD protection stages wherein each of the protection stages comprises said parallel straight strip segments of said doped polysilicon regions of opposite conductivity types constituting multiple Zener diodes wherein said ESD protection circuit further comprises a doped polysilicon strip as a resistor connected between said multiple ESD protection stages.

8. A semiconductor power device supported on a semiconductor substrate comprising a plurality of transistor cells each having a source and a drain with a gate to control an electric current transmitted between the source and the drain, wherein the semiconductor power device further comprising:
a source metal connected to said source, and a gate metal configured as a metal band extended from a gate pad surrounding a peripheral region of said semiconductor substrate connected to a gate pad wherein said gate metal and said gate pad are separated from said source metal by a metal gap;
an ESD protection circuit comprising a plurality of alternating doped polysilicon regions of opposite conductivity types extended as parallel straight strip segments parallel to said metal band constituting Zener diodes extending across said metal gap and having at least an outermost straight strip segment disposed directly under said gate metal the parallel strip segments contact an inner of said gate metal and at least an innermost straight strip segment opposite said outermost straight strip segment disposed directly under the source metal and the parallel strip segments contact an outer edge of said source metal wherein said Zener diodes disposed on a top surface of said semiconductor substrate near said peripheral region of said semiconductor substrate; and
said ESD protection circuit disposed on said peripheral region further comprises multiple ESD protection stages wherein a first stage of said ESD protection circuit is disposed closest to said gate pad having a largest number of the parallel straight strip segments of the doped polysilicon regions constituting said Zener diodes among said multiple ESD protection stages.

9. A semiconductor power device supported on a semiconductor substrate comprising a plurality of transistor cells each having a source and a drain with a gate to control an electric current transmitted between the source and the drain, wherein the semiconductor power device further comprising:
a source metal connected to said source, and a gate metal configured as a metal stripe surrounding a peripheral region of said substrate connected to a gate pad connected to said gate wherein said gate metal and said gate pad are separated from said source metal by a metal gap; and
an ESD protection circuit comprises at least two ESD protection stages with each stage including a plurality of doped polysilicon regions of opposite conductivity types extended as parallel straight strip segments parallel to said metal stripe disposed on a top surface of said semiconductor substrate in said metal gap constituting ESD diodes extending across said metal gap and having at least an outermost straight strip segment disposed directly under said gate metal and the parallel strip segments contact an inner edge of said gate metal and at least an innermost straight strip segment opposite said outermost straight strip segment disposed directly under said source metal and said parallel strip segments contact an outer edge of said source metal on said peripheral region of said semiconductor substrate wherein each of said ESD protection stage have different widths and different number of pairs of doped polysilicon regions.

10. The semiconductor power device of claim 9 wherein:
said ESD protection circuit further comprises a pair of doped polysilicon regions extended as parallel straight strip segments adjacent to said gate pad as a separate ESD protection circuit network further having multiple ESD protection stages each having a plurality of doped polysilicon regions configured as said parallel straight strip segments constituting said ESD diodes disposed on said peripheral regions of said semiconductor substrate.

11. The semiconductor power device of claim 10 wherein:
said pair of doped polysilicon regions extended as said parallel straight strip segments adjacent to said gate pad has a greater number of pairs of doped polysilicon regions than said ESD protection circuit disposed at said peripheral region away from said gate pad; and
said ESD protection stages disposed on said peripheral region further includes a first ESD protection stage-has a largest number of pairs of doped polysilicon regions extended as said parallel straight strip segments for reducing a gate leakage current and said first ESD protection stage having greater width perpendicularly across said parallel straight strip segments than said pair of doped polysilicon regions surrounding said gate pad.

12. A semiconductor power device supported on a semiconductor substrate comprising:
an ESD protection circuit comprising at least two ESD protection stages with each stage includes a plurality of doped polysilicon regions of opposite conductivity types disposed on a top surface of said semiconductor substrate extended as parallel straight strip segments constituting ESD diodes extending across a metal gap and having at least an outermost straight strip segment disposed directly under said gate metal and the parallel strip segments contact an inner edge of said gate metal and at least an innermost opposite said outermost straight strip segment disposed directly under said source metal and the parallel strip segments contact an outer edge of a source metal on a peripheral region of said substrate wherein a first ESD protection stage has a width perpendicularly across said parallel straight strip segments based on a predefined ESD rating and a largest number of pairs of doped polysilicon regions among said ESD protection stages and based on a predefined gate leakage current.

13. The semiconductor power device of claim 12 wherein:
said ESD protection circuit further comprising a pair of doped polysilicon regions extended as parallel straight strip segments adjacent to a gate pad as a separate ESD protection circuit network having a highest breakdown voltage among said ESD protection stages and a lower breakdown voltage than a gate oxide breakdown voltage for protecting a thin gate oxide layer.

14. The semiconductor power device of claim 12 wherein:
said ESD protection circuit further having multiple ESD protection stages each having a plurality of said doped polysilicon regions as said ESD diodes extended as said parallel straight strip segments parallel to said gate metal configured as a gate metal band disposed on said peripheral region of said semiconductor substrate.

15. A method for protecting a semiconductor power device supported on a semiconductor substrate from an ESD pulse comprising:
forming an ESD protection circuit with at least two ESD protection stages by including in each stage a plurality of doped polysilicon regions of opposite conductivity types extended as parallel straight strip segments parallel to a gate metal band surrounding a peripheral said semiconductor substrate with said doped polysilicon regions disposed on a top surface of said semiconductor substrate for functioning as ESD diodes and having at least an outermost straight strip segment disposed directly said gate metal and the parallel strip segments contact an inner edge of said gate metal and at least an innermost straight strip segment opposite said outermost straight strip segment disposed directly under said source metal and the parallel strip segments contact an outer edge of a source metal on a peripheral region of said semiconductor substrate; and
forming a first ESD protection stage with a width perpendicularly across said parallel straight strip segments based on a predefined ESD rating and a largest number of pairs of said parallel straight strip segments of said doped polysilicon regions among said multiple ESD protection stages based on a predefined gate leakage current.

16. The method of claim 15 further comprising a step of:
protecting a thin gate oxide layer by forming a pair of said ESD protection stages surrounding a gate pad disposed near said peripheral of said semiconductor substrate connected to said gate metal band wherein each of said ESD protection stages comprises said doped polysilicon regions extended as the parallel straight strip segments as a separate ESD protection circuit network having a lowest breakdown voltage among said ESD protection stages.

17. The method of claim 16 further comprising a step of:
forming at least another ESD protection stage in addition to the pair of said ESD protection stages as part of said ESD protection circuit network by forming a plurality of doped polysilicon regions configured as said parallel straight strip segments constituting the ESD diodes disposed near said peripheral of said semiconductor substrate.

* * * * *